United States Patent [19]
Nash et al.

[11] 4,193,118
[45] Mar. 11, 1980

[54] LOW PASS DIGITAL AVERAGING FILTER

[75] Inventors: Harold G. Nash, Tempe, Ariz.; John R. Linford, Broomfield, Colo.

[73] Assignee: Motorola, Inc., Schaumburg, Ill.

[21] Appl. No.: 925,719

[22] Filed: Jul. 18, 1978

[51] Int. Cl.² .............................................. G06F 7/38
[52] U.S. Cl. .................................... 364/734; 364/575
[58] Field of Search ............... 364/734, 724, 575, 602, 364/811, 200, 900; 328/158, 167; 307/203

[56] References Cited
U.S. PATENT DOCUMENTS

| | | | |
|---|---|---|---|
| 3,441,720 | 4/1969 | Lazeki | 364/734 X |
| 3,478,328 | 11/1969 | Schillinger | 364/734 X |
| 3,704,364 | 11/1972 | Roeshlein et al. | 364/734 X |
| 4,054,786 | 10/1977 | Vincent | 364/734 X |

*Primary Examiner*—David H. Malzahn
*Attorney, Agent, or Firm*—Marvin A. Glazer; Walter W. Nielsen

[57] ABSTRACT

A circuit for extracting a low frequency signal component from a composite signal is disclosed which uses a digital averaging technique for filtering out higher frequency components. An analog to digital converter receives a composite analog signal and provides a digital output signal. The composite analog signal is sampled during periodic intervals or sample periods. The digital output signal of the analog to digital converter is coupled to one input port of an adder/subtractor circuit and to the input of a sample register. The sample register stores the digital output signal and outputs the stored signal, delayed by a predetermined number of sample periods, to a second input port of the adder/subtractor. A storage register is used to store a running average which is equal to the sum of the digital signals received during the most recent predetermined number of sample periods. The average signal stored by the storage register is fed back to a third input port of the adder/subtractor. During each sample period, the adder/subtractor causes the current output of the analog to digital converter to be added to the previous average signal and causes the output of the sample register to be subtracted from the average signal. The result generated by the adder/subtractor is then stored in the storage register until the next sample period, during which the procedure is repeated.

9 Claims, 4 Drawing Figures

LOW PASS DIGITAL AVERAGING FILTER

CROSS REFERENCE TO RELATED APPLICATIONS

1. "Digital Carrier Correction Circuit", invented by Harold Garth Nash and Gene Arnold Schriber, bearing Ser. No. 748,028, filed on Dec. 6, 1976 and assigned to the assignee of the present invention.

2. "Quasi Digital Multiplier", invented by Harold Garth Nash, bearing Ser. No. 925,680, filed on even date herewith and assigned to the assignee of the present invention.

BACKGROUND OF THE INVENTION

1. Field of the Invention

This invention relates generally to low pass filters and more particularly to a low pass filter employing analog to digital conversion and digital averaging techniques.

2. Description of the Prior Art

Low pass filters for recovering low frequency components of a signal spectrum are well known in the art. Analog techniques utilizing linear R-C networks are often employed to filter an analog signal. However, R-C networks do not lend themselves to practical implementation with complex IC technology. Additionally, the stability of linear filters is a function of the resistor and capacitor component parameters, which may vary with age and temperature and which vary from one component to another, thereby requiring alignment in the factory. Also, linear R-C type filters are not ideal filters in that the signal passed by such a filter includes small contributions from signals received in the past.

Digital filtering techniques have also been used in the past, but these techniques often require high speed multipliers, shift registers, read-only memories (ROM's), and a plurality of adders. These prior art digital filters require large amounts of chip area when fabricated as an integrated circuit, thereby reducing wafer yields and resulting in higher cost. Thus, it will be appreciated by those skilled in the art that a low pass digital averaging filter which can easily be implemented within an integrated circuit and which requires a small amount of chip area is a significant improvement over the prior art.

SUMMARY OF THE INVENTION

An object of the present invention is to provide a low pass filter which may easily be implemented within an integrated circuit.

It is also an object of the present invention to provide a low pass filter having filtering characteristics which are independent of variations in the parameters of the components used to implement the filter.

It is a further object of the present invention to provide a low pass digital averaging filter which provides a digital output signal corresponding to the magnitude of the desired low frequency component.

It is a further object of the present invention to provide a low pass digital averaging filter having filtering characteristics solely dependent upon an input clock pulse.

Briefly described the invention relates to an apparatus and a method for establishing a running average for a sequence of digital signals including circuitry for receiving a plurality of input digital signals, circuitry for storing a predetermined number of the received input digital signals and for providing the stored digital signals as an output signal a predetermined number of sample periods following the sample period during which each signal was stored, circuitry for storing an average digital signal, and arithmetic circuitry for adding a presently received input digital signal to the average digital signal and for subtracting the input digital signal received the predetermined number of sample periods prior to the present sample period from the average digital signal such that the average digital signal is updated during each sample period. In the preferred embodiment, an analog to digital converter receives an analog input signal and is a source of the input digital signals. In this embodiment, the running average of the input digital signals corresponds to the low frequency component of the analog signal received by the digital to analog converter.

DESCRIPTION OF THE PREFERRED EMBODIMENTS

Figure 1:
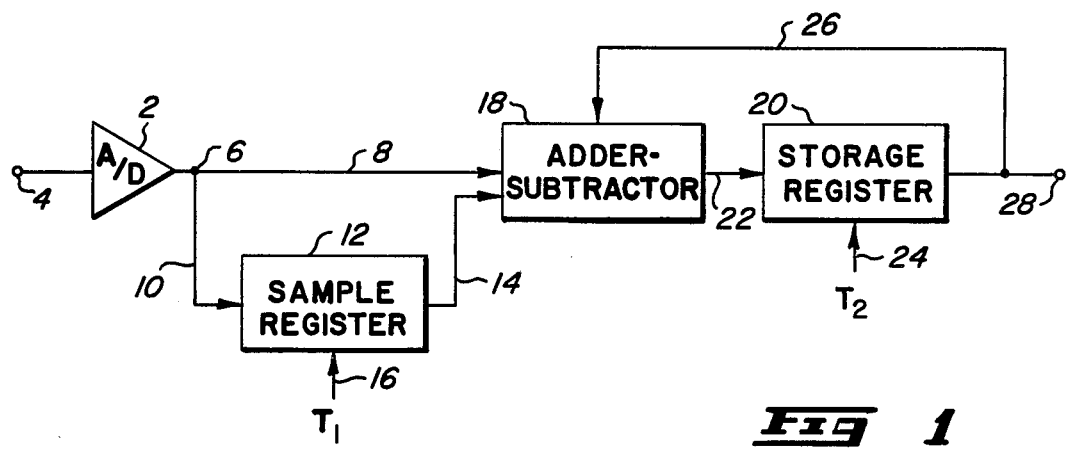
FIG. 1 is a block diagram of a preferred embodiment of the invention including an analog to digital converter for receiving an analog signal.

FIG. 1 illustrates a low pass digital averaging filter according to a preferred embodiment of the invention. An analog to digital converter 2 has an input terminal 4 for receiving a composite analog input signal. The output of analog to digital converter 2 is coupled to node 6, and node 6 is coupled to conductors 8 and 10. Those skilled in the art will realize that the output of analog to digital converter 2 consists of a plurality of binary bits, each of which is typically associated with a particular binary weighting so that the plurality of binary bits corresponds to the magnitude of the received analog signal. The output of the analog to digital converter 2 may also include a sign bit for indicating positive and negative magnitudes. However, for the ease of illustration, conductors 8 and 10 are shown as single lines in FIG. 1. Analog to digital converters are well known in the art and will not be further described herein. For a more detailed description of analog to digital conversion, see *Digital Electronics with Engineering Applications* by Sifferlen and Vartanian, Prentiss-Hall Inc., 1970.

Conductor 10 couples the output of analog to digital converter 2 to the input of sample register 12. In the preferred embodiment, sample register 12 in a shift register having a predetermined number of storage locations for storing a predetermined number of digital words. Each of the stored digital words has as many binary bits as are provided by the output of analog to digital converter 2. Sample register 12 has an output coupled to conductor 14.

A timing signal or clock, $T_1$, is coupled to sample register 12 by conductor 16. Timing signal $T_1$ is pulsed at a periodic rate so as to define a plurality of sample periods. During each sample period, timing signal $T_1$ is pulsed, and the digital signal currently being output by analog to digital converter 2 is shifted into sample register 12 via conductor 10. If it is assumed that sample register 12 contains eight storage locations, for example, then sample register 12 will be filled with eight digital values after the first eight sample periods. During the ninth sample period, timing signal $T_1$ will again be pulsed, and a new digital value with be shifted into sample register 12. Simultaneously the digital value shifted in sample register 12 during the first sample period will be shifted out onto conductor 14 as an output value.

Thus, sample register 12 acts as a delay element to provide the digital value received eight sample periods prior to the present sample period. Although sample register 12 has been characterized in this preferred embodiment as a shift register, it will be obvious to those skilled in the art that various other storage means may be used to implement sample register 12.

Conductors 8 and 14 are coupled to first and second inputs, respectively, of adder/subtractor block 18. Adder/subtractor block 18 is coupled to storage register 20 by conductor 22. It should again be realized that conductor 22 symbolizes a group of conductors sufficient to transmit a digital value having a number of binary bits corresponding to the number of binary bits provided by the output of analog to digital converter 2. Timing signal $T_2$ is coupled to storage register 20 by conductor 24, and when pulsed, causes storage register 20 to store the digital value presented by conductor 22. Storage register 20 provides an output coupled to conductor 26 for providing the digital value currently being stored. The output of storage register 20 is also coupled to output terminal 28 such that other circuitry (not shown) can access the digital value being stored by storage register 20. The output of storage register 20 is fed back by conductor 26 to a third input of adder/subtractor block 18.

The operation of the circuitry shown in FIG. 1 will now be described. It will again be assumed that sample register 12 contains eight storage locations for storing eight digital values, it being understood that the number eight is chosen only as an example. Sample register 12 is initialized to contain eight digital values, each equal to a zero value, and storage register 20 is initialized to contain a zero value. During the first sample period, timing signal $T_1$ is pulsed, and the first digital value is shifted into sample register 12. A zero value is shifted out of sample register 12 onto conductor 14. Adder/subtractor block 18 adds the first digital value presented by conductor 8 to the zero value presented by conductor 26 and subtracts the zero value presented by conductor 14 such that the output provided to conductor 22 is equal to the digital value provided by conductor 8. Timing signal $T_2$ is then pulsed, and storage register 20 stores this initial digital value.

During the second sample period, a second digital value is output by analog to digital converter 2 and timing signal $T_1$ is again pulsed so as to shift this second digital value into sample register 12. A zero value is again shifted out onto conductor 14. During this second sample period, adder/subtractor block 18 adds the second digital value on conductor 8 to the first digital value stored by storage register 20 and presented by conductor 26, and subtracts the zero value provided by conductor 14 such that the output provided to conductor 22 is equal to the sum of the first and second digital values. Timing signal $T_2$ is then pulsed to store this sum into storage register 20. This sequence of events is repeated up to and including the eighth sample period, after which time storage register 20 contains the sum of the first eight sampled digital values. The sum stored by storage register 20 is thus proportional to the average of the first eight digital values.

During the ninth sample period, a new digital value is provided by analog to digital converter 2 which is shifted into sample register 12. Simultaneously sample register 12 causes the first digital value which was received during the first sample period to be shifted out onto conductor 14. During this ninth sample period, adder/subtractor block 18 adds the new digital value on conductor 8 to the sum previously stored by storage register 20 and provided by conductor 26. Adder/subtractor block 18 is also operative to subtract the digital value received during the first sample period such that the output provided to conductor 22 equals the sum of the digital values received during the second through ninth sample periods. Timing signal $T_2$ is again pulsed to store this result in storage register 20. Thus the value now stored by storage register 20 is proportional to the average of the digital values received during the most recent eight sample periods. In this manner, storage register 20 maintains a running average of only those digital values received during the most recent eight sample periods.

Figure 2:
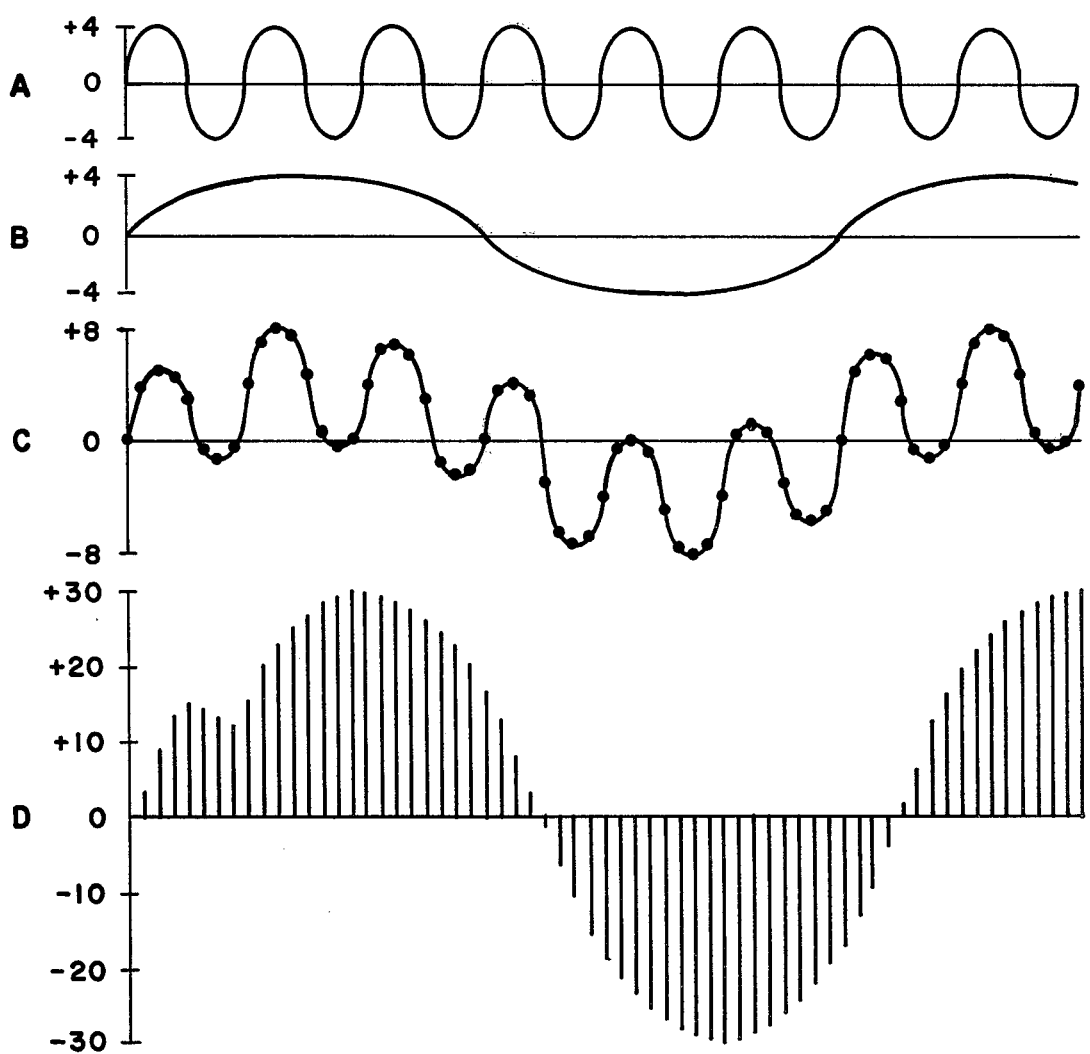
FIG. 2 is a series of timing waveforms including (A) a high frequency component of an analog signal, (B) a low frequency component of an analog signal, (C) the composite analog signal which is formed by combining the low frequency and high frequency components, and (D) the low frequency digital component of the composite analog signal as derived according to the invention.

In FIG. 2, the operation of the low pass digital averaging filter is illustrated. Waveform A illustrates a high frequency component of a signal and waveform B illustrates a low frequency component of the same signal. Waveform C illustrates the composite signal formed by combining the high frequency and low frequency components illustrated in waveforms A and B, respectively. The composite analog waveform C is presented to input terminal 4 of analog to digital converter 2 (FIG. 1). The points at which the analog composite waveform are sampled by analog to digital converter 2 are indicated by the dots which intersect the composite voltage waveform. Waveform D is a plot of the sign and magnitude of the digital value, represented by the direction and length of each line segment, stored by storage register 20 (FIG. 1) during each sample period. It will be appreciated that waveform D effectively recovers the low frequency component shown in waveform B from composite voltage waveform C.

The analog equivalent of the circuit illustrated in FIG. 1 is a low pass filter with a corner frequency located at $\omega_c = 1/T$, where T is the time required to process the predetermined number of sampled digital signals. Assuming that the sample register contains eight storage locations, then T corresponds to eight sample periods. Thus, the operation of the low pass digital averaging filter is dependent solely upon the clock frequency and is not dependent upon device parameters of particular circuit components.

Figure 3:
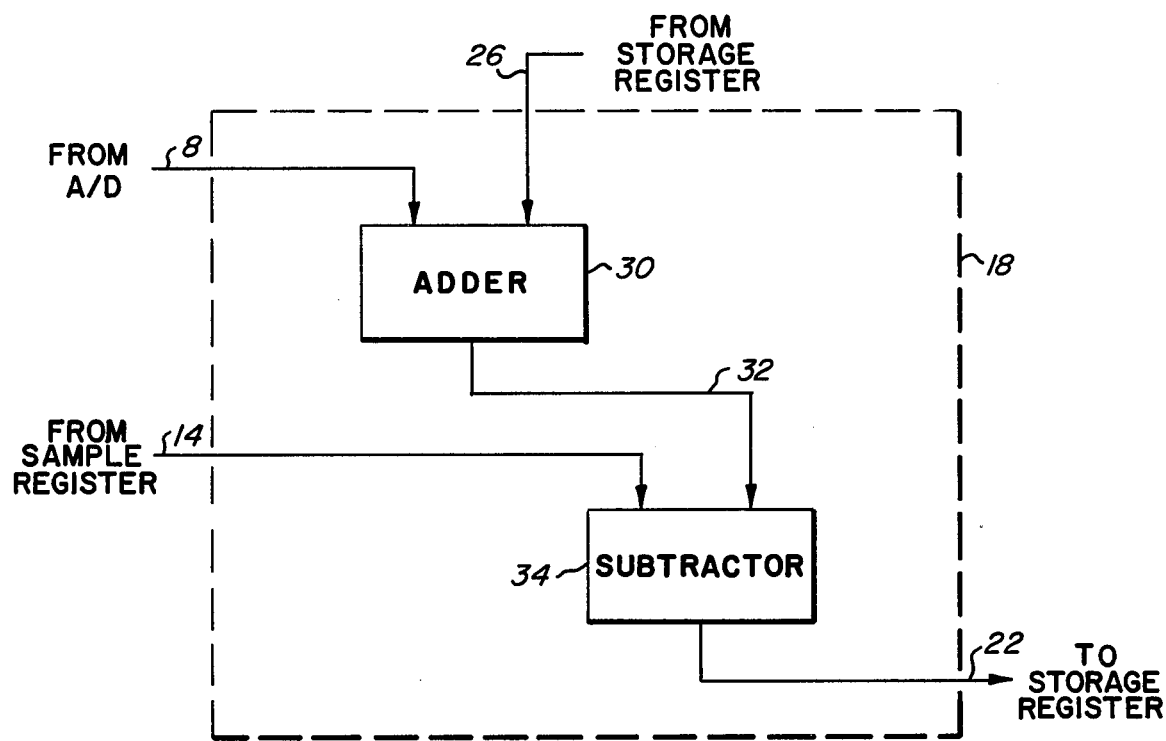
FIG. 3 is a more detailed block diagram of one embodiment of the adder/subtractor block shown in FIG. 1.

In FIG. 3 one embodiment of adder/subtractor 18 is shown in greater detail. An adder block 30 receives the previous average digital value stored by storage register 20 via conductor 26 and receives a new digital value from analog to digital converter 2 via conductor 8. The digital values are added and the result of the addition is output on conductor 32 which is coupled to a first input of subtractor block 34. A second input of subtractor 34 is coupled by conductor 14 to the output of the sample register 12. Subtractor block 34 causes the digital value presented by conductor 14 to be subtracted from the digital value provided by conductor 32 and provides an output to conductor 22 to allow the result of the subtraction to be stored in storage register 20. As circuitry for implementing adder block 30 and subtractor block 34 is well known in the art, this circuitry will not be further described.

Figure 4:
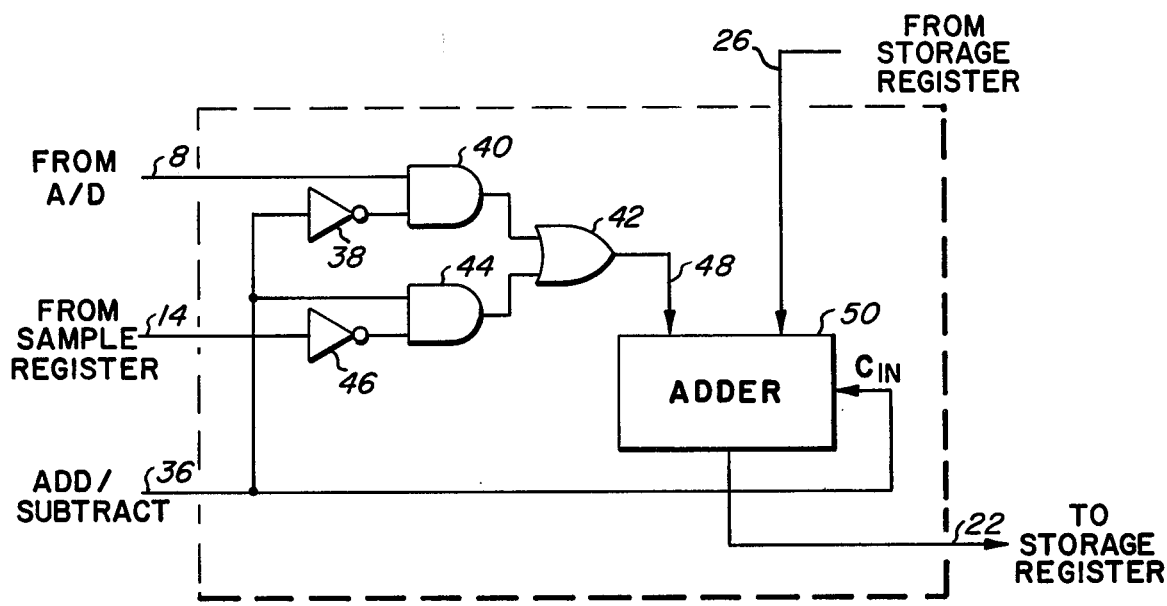
FIG. 4 is a more detailed logic diagram of the adder/subtractor block shown in FIG. 1 which employs a multiplexing technique for performing addition and subtraction.

In FIG. 4 a second embodiment of adder/subtractor block 18 is shown in greater detail. The embodiment illustrated by FIG. 4 employs a multiplexing technique whereby a first portion of the sample period is used to add the new digital value output from the analog to digital converter to the previously stored average value, and the result of this addition is temporarily stored in storage register 20. During a second portion of the sample period, the output from the sample register 12 is subtracted from the temporarily stored value to form the updated average value, which is then stored in storage register 20.

Conductor 36 is an add/subtract control line which is a logic "0" level to select the addition operation and which is a logic "1" level to select the subtraction operation. In this embodiment, it is assumed that digital values are represented in two's-complement notation. Conductor 36 is coupled to the input of inverter 38 which has an output coupled to a first input of logic AND gate 40. A second input of AND gate 40 receives the digital value output by analog to digital converter 2 via conductor 8. It should be realized that in reality there are a plurality of logic gates corresponding to gate 40 corresponding to the number of binary bits output by analog to digital converter 2. A single AND gate 40 is shown for the ease of illustration only. The output of AND gate 40 is coupled to a first input of logic OR gate 42 which has a second input coupled to the output of logic AND gate 44. Conductor 36 is coupled to a first input of gate 44 while a second input of gate 44 is coupled to the output of inverter gate 46. Inverter gate 46 receives at its input the digital value provided by the output of sample register 12 via conductor 14. The output of OR gate 42 is coupled by conductor 48 to a first input of adder circuit 50. A second input of adder 50 is coupled to conductor 26 which provides the digital value output from the storage register 20. Conductor 36 is also coupled to a carry-in $C_{IN}$ input of adder 50 for causing the result of the addition to be incremented. The output of adder 50 is coupled by conductor 22 to the input of storage register 20.

When conductor 36 is at a logic "0" level, the output of inverter gate 38 will be a high level and gate 40 will be enabled while gate 44 will be disabled. The new digital value provided by conductor 8 will be passed to conductor 48 to be added within adder block 50 with the previously stored average value provided by conductor 26. The result of the addition is not incremented, and the result is temporarily stored in storage register 20. Conductor 36 is then switched to a logic "1" level which causes gate 44 to be enabled and gate 40 to be disabled. The digital value provided by the sample register is complemented (one's-complement) by inverter 46, and the complemented value is passed to conductor 48 to be added to the value temporarily stored in storage register 20 during the previous portion of the sample period. The result of the addition is incremented such that adder circuit 50 adds the two's-complement of the digital value provided from the sample register which is the same as subtracting the digital value provided from the sample register. The result of the two's-complement addition is then stored in storage register 20 and corresponds to the updated average value. It will be obvious to those skilled in the art that the order of the addition and subtraction operations can be reversed without materially affecting the performance of the low pass averaging filter.

While the invention has been described with reference to a preferred embodiment the description is for illustrative purposes only and is not to be construed as limiting the scope of the invention. Various modifications and changes may occur to those skilled in the art without departing from the true spirit and scope of the invention as defined in the appended claims.

What is claimed is:

1. An apparatus for establishing a running average for a sequence of digital signals, comprising:
   a. first means for receiving a plurality of input digital signals during a corresponding plurality of sequential sample periods;
   b. second means coupled to said first means for storing a predetermined number N of the input digital signals, said second means also being for storing an input digital signal received during a present sample period and providing an output digital signal corresponding to an input digital signal received N sample periods prior to the present sample period;
   c. third means for storing an average digital signal; and
   d. an arithmetic means coupled to said first means, to said second means and to said third means for adding the input digital signal received during the present sample period to the average digital signal and for subtracting the output digital signal from the average digital signal for updating the average digital signal stored by said third means.

2. An apparatus as recited in claim 1 wherein the average digital signal stored by said third means is the sum of input digital signals received during the most recent predetermined number N of sample periods.

3. An apparatus as recited in claim 2 wherein said second means comprises a shift register having N storage locations, the N storage locations including at least a first and a last storage location, each of the N storage locations being suitable for storing a digital signal, the shift register including means for shifting the input digital signal received during the present sample period into the first storage location, means for shifting the digital signal stored by the first storage location to subsequent storage locations, and means for shifting the digital signal stored by the last storage location to an output port for providing the output digital signal.

4. An apparatus as recited in claim 2 wherein said third means comprises a storage register having output means for providing the average digital signal stored by the storage register to said arithmetic means, and having input means for receiving an updated average digital signal from said arithmetic means.

5. An apparatus as recited in claim 4 wherein said arithmetic means comprises first, second, and third input means and an output means, the first input means being coupled to said first means for receiving the input digital signal received during the present sample period, the second input means being coupled to said second means for receiving the output digital signal, the third input means being coupled to the output means of the storage register for receiving the average digital signal, and the output means being coupled to the input means of the storage register for providing the updated average digital signal.

6. An apparatus as recited in claim 4 wherein said arithmetic means comprises multiplexing means and adder-subtractor means, the multiplexing means being for coupling the input digital signal received during the present sample period to the adder-subtractor means during a first portion of the present sample period and coupling the output digital signal to the adder-subtractor means during a second portion of the present sample period, the adder-subtractor means being for adding the input digital signal received during the present sample period to the average digital signal during the first portion and being for subtracting the output digital signal from the average digital signal during the second portion for providing the updated average digital signal.

7. A low pass averaging filter for providing a low frequency component of an analog input signal, comprising:
   a. an analog to digital converter having an input terminal for receiving the analog input signal and having output terminals for providing a digital representation of the received analog input signal;
   b. timing means for generating a timing signal that defines sequential sample periods;
   c. delay means coupled to said analog to digital converter and responsive to the timing signal for storing the digital representation provided by the output terminals during a present sample period and for providing the stored digital representation as an output digital signal during a sample period which occurs a predetermined number N of sample periods subsequent to the present sample period;
   d. storage means responsive to the timing signal for storing an average digital signal during each sample period; and
   e. arithmetic means coupled to said analog to digital converter, to said delay means, and to said storage means for adding the digital representation provided during the present sample period to the stored average digital signal and for subtracting the output digital signal provided by the delay means during the present sample period from the stored average digital signal for providing an updated average digital signal for storage by said storage means.

8. A low pass averaging filter as recited in claim 7 wherein said delay means comprises a shift register having N storage locations, each of the storage locations being suitable for storing a digital representation provided by said analog to digital converter.

9. A method of recovering a low frequency component of a composite analog waveform, comprising the steps of:
   (a) converting the analog waveform to a digital representation during periodic sample intervals;
   (b) storing the digital representation provided by said converting step and providing the stored digital representation as a delayed representation a predetermined number of sample intervals following the sample interval during which the digital representation was stored;
   (c) storing an average signal; and
   (d) updating the average signal during each sample interval, said updating step including the steps of adding the digital representation provided by the converting step to the average signal and subtracting the delayed representation from the average signal.

* * * * *